US008446542B2

(12) United States Patent
Ma

(10) Patent No.: US 8,446,542 B2
(45) Date of Patent: May 21, 2013

(54) DISPLAY MODULE

(75) Inventor: Chuan-Cho Ma, Taipei (TW)

(73) Assignee: Chunghwa Picture Tubes, Ltd., Bade, Taoyuan (TW)

(*) Notice: Subject to any disclaimer, the term of this patent is extended or adjusted under 35 U.S.C. 154(b) by 287 days.

(21) Appl. No.: 12/891,822

(22) Filed: Sep. 28, 2010

(65) Prior Publication Data
US 2012/0039024 A1 Feb. 16, 2012

(30) Foreign Application Priority Data

Aug. 10, 2010 (TW) ................................. 99126600 A

(51) Int. Cl.
*G02F 1/1333* (2006.01)

(52) U.S. Cl.
USPC .............................. 349/58; 349/56

(58) Field of Classification Search
USPC ...................................... 349/58–60
See application file for complete search history.

(56) References Cited

U.S. PATENT DOCUMENTS

| | | | | |
|---|---|---|---|---|
| 5,161,028 A * | 11/1992 | Kawata et al. | ................ | 348/837 |
| 6,512,558 B2 * | 1/2003 | Kim | ................ | 349/58 |
| 6,835,961 B2 * | 12/2004 | Fukayama | ................ | 257/84 |
| 6,847,417 B2 * | 1/2005 | Kim | ................ | 349/58 |
| 7,118,265 B2 * | 10/2006 | Cho | ................ | 362/606 |
| 7,224,416 B2 * | 5/2007 | Cha et al. | ................ | 349/60 |
| 7,244,966 B2 * | 7/2007 | Fukayama | ................ | 257/98 |
| 7,248,307 B2 * | 7/2007 | Han | ................ | 349/58 |
| 7,443,460 B2 * | 10/2008 | Park | ................ | 349/58 |
| 7,481,569 B2 * | 1/2009 | Chang | ................ | 362/633 |
| 7,744,265 B2 * | 6/2010 | Kang et al. | ................ | 362/633 |
| 2002/0109802 A1 * | 8/2002 | Cheng et al. | ................ | 349/58 |
| 2003/0169383 A1 * | 9/2003 | Kim | ................ | 349/58 |
| 2003/0223020 A1 * | 12/2003 | Lee | ................ | 349/58 |
| 2004/0246397 A1 * | 12/2004 | Kang et al. | ................ | 349/58 |
| 2005/0099555 A1 * | 5/2005 | Kim | ................ | 349/58 |
| 2006/0290836 A1 * | 12/2006 | Chang | ................ | 349/58 |
| 2007/0047265 A1 | 3/2007 | Kang | | |
| 2007/0132908 A1 * | 6/2007 | Kim et al. | ................ | 349/58 |
| 2012/0039024 A1 * | 2/2012 | Ma | ................ | 361/679.01 |

FOREIGN PATENT DOCUMENTS

CN 1534964 A 10/2004
TW M326175 1/2008

* cited by examiner

*Primary Examiner* — Rhonda Peace
(74) *Attorney, Agent, or Firm* — Winston Hsu; Scott Margo

(57) ABSTRACT

A display module includes a bottom casing, a panel device, and an upper casing. The bottom casing includes a casing body and a holding structure. The holding structure is integrally formed on the casing body and has a bottom pillar. The panel device is disposed on the bottom casing. The panel device includes at least one film component and a display panel. The film component has at least one positioning lug. The positioning lug is used for disposing around the bottom pillar so as to position the film component onto the holding structure. The display panel is disposed on the holding structure. The upper casing is disposed on the panel device for fixing the panel device cooperatively with the bottom casing.

18 Claims, 6 Drawing Sheets

DISPLAY MODULE

BACKGROUND OF THE INVENTION

1. Field of the Invention

The present invention relates to a display module, and more particularly, to a display module for utilizing a holding structure formed on a bottom casing to contain a display panel.

2. Description of the Prior Art

With the development of electronic industry, portable electronic devices have made great progress on portability, and a notebook computer is one of the most representative examples. In order to reduce the thickness of the notebook computer for a user to carry conveniently, a slim design is usually applied to the key components (e.g. a liquid crystal display module) of the notebook computer in size.

Generally speaking, in an assembly process of a liquid crystal display module, first of all, a back plate is utilized to support backlight components (e.g. a light guide plate, a reflective sheet and so on) and a plastic frame is utilized to support film components (e.g. a lens film, a diffuser film and so on). Subsequently, an upper casing is utilized to contain a display panel and the said components cooperatively with a bottom casing, so as to complete the assembly process of the liquid crystal display module.

As mentioned above, the said frame structures (e.g. the back plate) are needed to position and fix the related components during the assembly process of the liquid crystal display module. Thus, in the prior art, a common slim design for the liquid crystal display module is to omit the back plate. Please refer to FIG. 1, which is an exploded diagram of a display module 10 according to the prior art. As shown in FIG. 1, the display module 10 includes an upper casing 12, a panel device 14, a plastic frame 16 and a bottom casing 18. The panel device 14 is disposed on the plastic frame 16. The plastic frame 16 has at least one positioning lug 20 (four shown in FIG. 1). Next, please refer to FIG. 2, which is an assembly diagram of the plastic frame 16 in FIG. 1 being disposed on the bottom casing 18. As shown in FIG. 2, after the panel device 14 is installed on the plastic frame 16, the plastic frame 16 can be fixed to the bottom casing 18 by utilizing screws to pass through the positioning lug 20 of the plastic frame 16 and then be screwed onto the bottom casing 18. After utilizing the upper casing 12 and the bottom casing 18 in FIG. 1 to cooperatively fix the panel device 14, the assembly process of the display module 10 is completed accordingly.

As known in the said assembly process, since the back plate is omitted, the plastic frame is needed to directly assemble with the bottom casing in this design, such that the backlight components, the film components and the display panel can be fixed between the upper casing and the bottom casing. However, the original structural constraints of the bottom casing may cause a difficult assembly process for the plastic frame and the bottom casing as well as an inconvenient related rework process.

In addition, since the protruding structure of the positioning lug of the plastic frame often constrains the circuit layout of the display module, it may cause a great inconvenience in assembly of the display module. Although the said problem can be solved by creating additional space for the circuit layout on the bottom casing, the additional space may make foreign objectives enter the display module easily.

SUMMARY OF THE INVENTION

The present invention provides a display module including a bottom casing, a panel device and an upper casing. The bottom casing includes a casing body and a holding structure. The holding structure is integrally formed on the casing body and has a bottom pillar. The panel device is disposed on the bottom casing and includes at least one film component having at least one positioning lug and a display panel. The positioning lug is used for disposing around the bottom pillar so as to position the film component on the holding structure. The display panel is disposed on the holding structure. The upper casing is disposed on the panel device for fixing the panel device cooperatively with the bottom casing.

The present invention further provides a display module including a bottom casing, a panel device and an upper casing. The bottom casing includes a casing body and a holding structure integrally formed on the casing body. The panel device is disposed on the bottom casing and includes at least one film component having at least one positioning lug and a display panel disposed on the holding structure. The upper casing is disposed on the panel device and has an upper pillar, and the upper pillar is used for disposing through the positioning lug so as to position the film component on the holding structure when the upper casing fixes the panel device cooperatively with the bottom casing.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
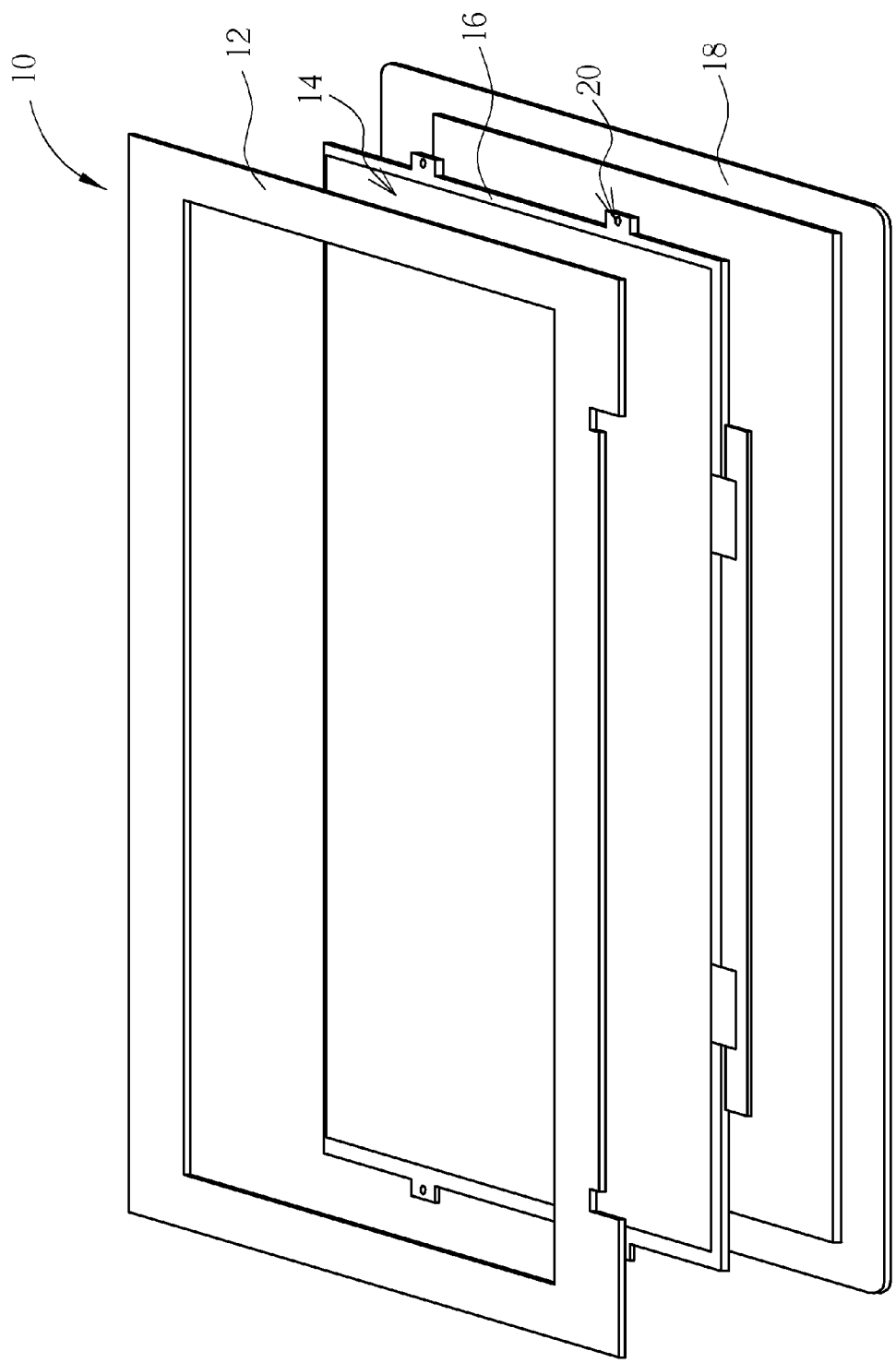
FIG. 1 is an exploded diagram of a display module according to the prior art.
Figure 2:
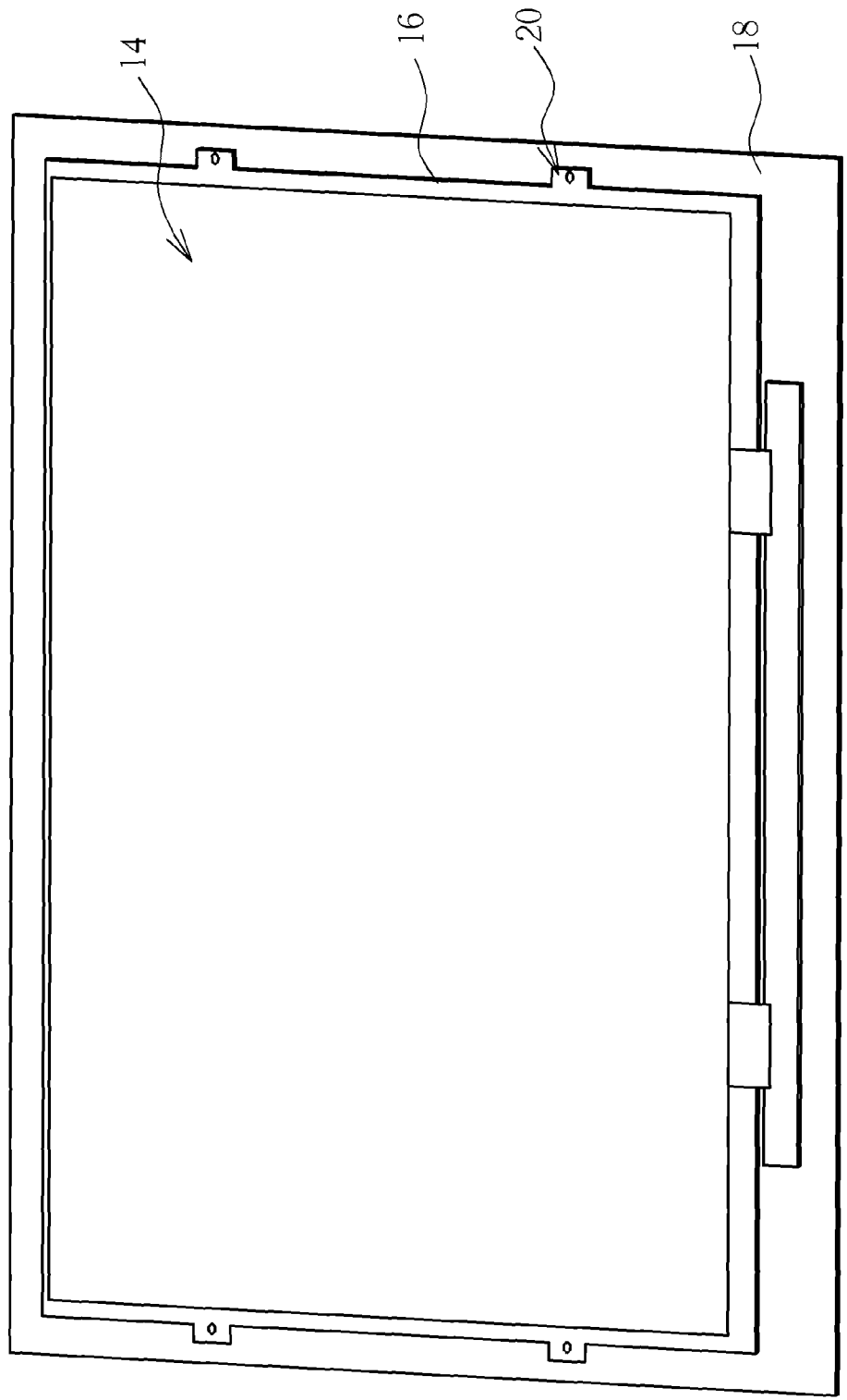
FIG. 2 is an assembly diagram of a plastic frame in FIG. 1 being disposed on a bottom casing.
Figure 3:
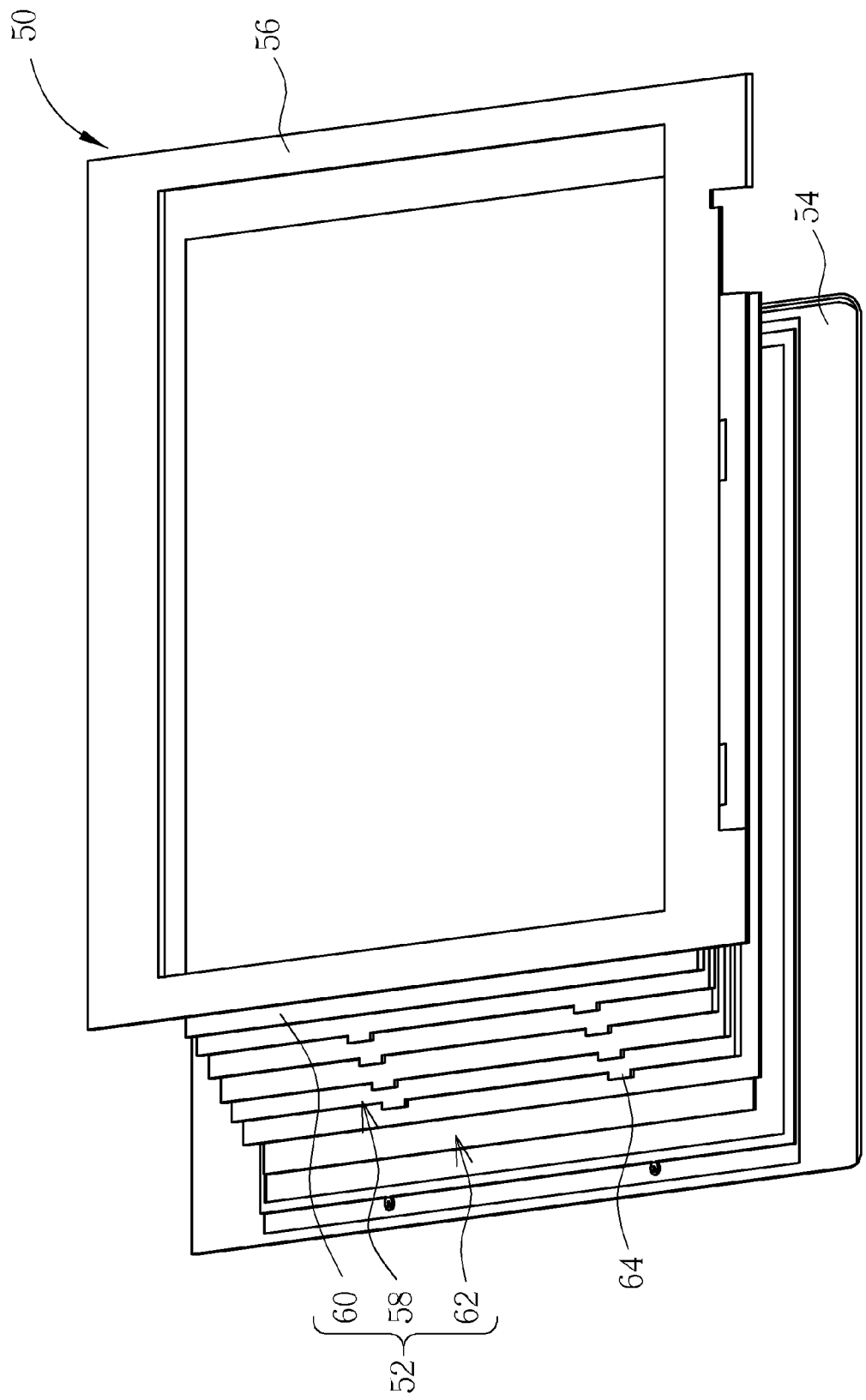
FIG. 3 is an exploded diagram of a display module according to a preferred embodiment of the present invention.

Please refer to FIG. 3, which is an exploded diagram of a display module 50 according to a preferred embodiment of the present invention. As shown in FIG. 3, the display module 50 includes a panel device 52, a bottom casing 54 and an upper casing 56. The panel device 52 is disposed on the bottom casing 54, and the upper casing 56 disposed on the panel device 52 for fixing the panel device 52 cooperatively with the bottom casing 54. The panel device 52 includes at least one film component 58 (four shown in FIG. 3), a display panel 60 and at least one backlight component 62 (two shown in FIG. 3). The film component 58 can be a conventional component of a display panel, such as a lens film, a diffuser film and so on. In this embodiment, a side of each of the film components 58 has at least one positioning lug 64 (two shown in FIG. 3).

Figure 4:
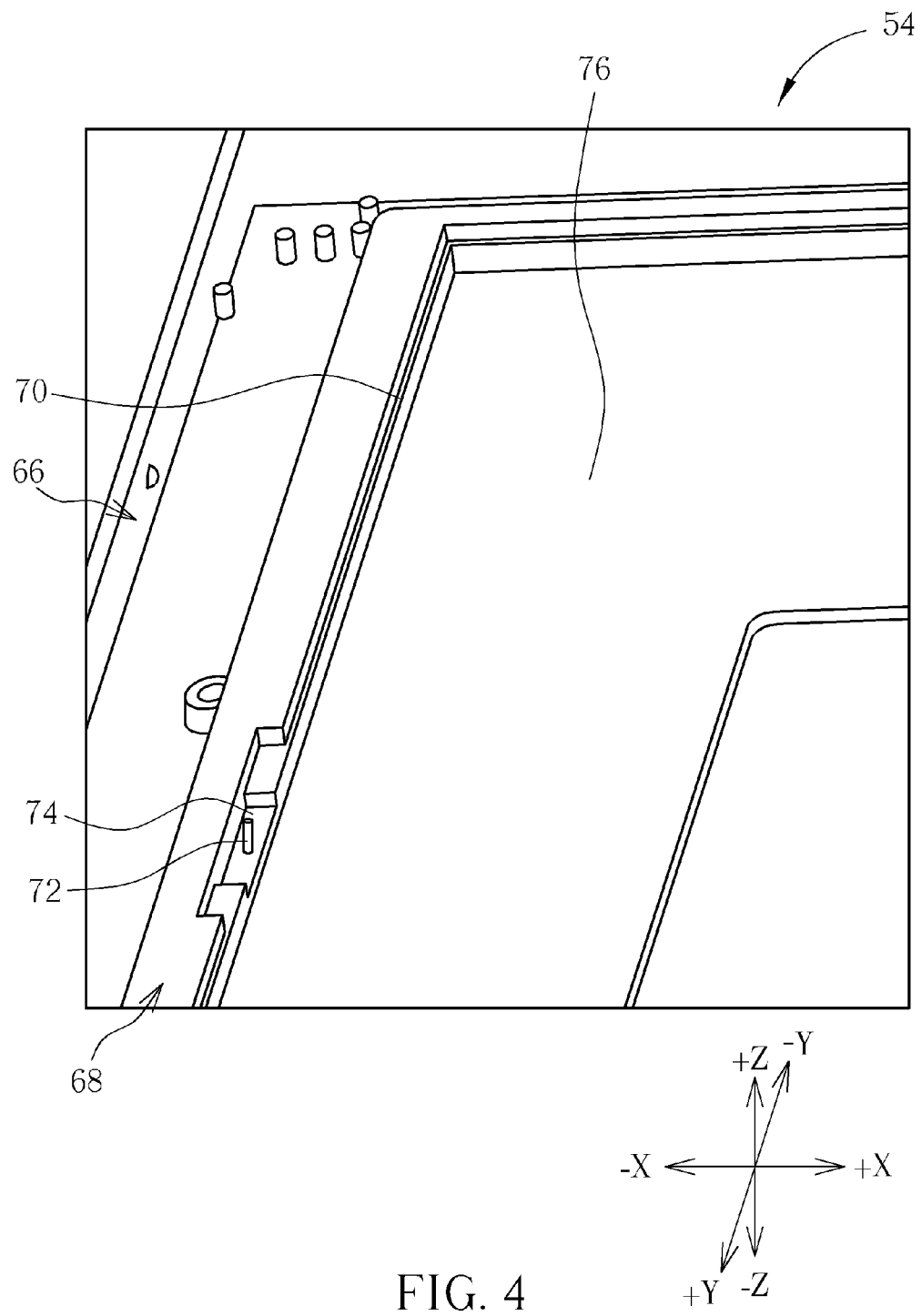
FIG. 4 is a partial enlarged diagram of the bottom casing in FIG. 3.
Figure 5:
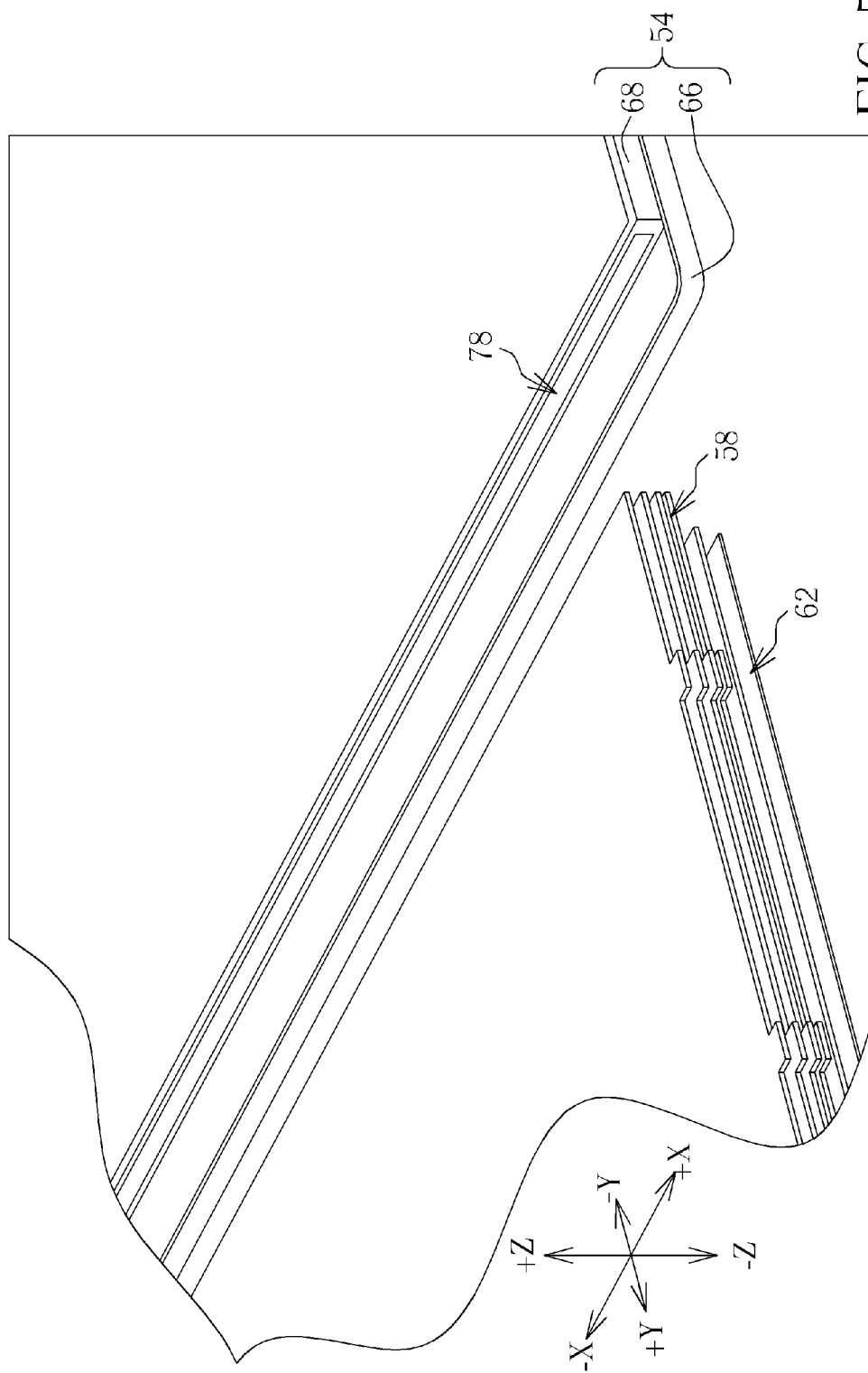
FIG. 5 is a diagram of a film component in FIG. 3 and a backlight component being extracted from a holding structure.

Next, please refer to FIG. 4, which is a partial enlarged diagram of the bottom casing 54 in FIG. 3. The bottom casing 54 includes a casing body 66 and a holding structure 68. The holding structure 68 is preferred to be integrally formed on the casing body 66. As shown in FIG. 4, the holding structure 68 has a panel containing portion 70, a bottom pillar 72 and a recessed portion 74. The panel containing portion 70 is used for holding the display panel 60 so as to position the display panel 60 onto the holding structure 68. The bottom pillar 72 is used for disposing through the positioning lug 64 of the film component 58, and the recessed portion 74 is used for containing the positioning lug 64 so as to position the film component 58 on the holding structure 68 cooperatively with the bottom pillar 72. In this embodiment, the holding structure 68 forms a containing space 76 cooperatively with the casing body 66 so as to contain the backlight component 62 and position the backlight component 62 on the bottom casing 54. In addition, please refer to FIG. 5, which is a diagram of the film component 58 in FIG. 3 and the backlight component 62 being extracted from the holding structure 68. As shown in FIG. 5, in this embodiment, an opening 78 is formed at a side of the holding structure 68, meaning that if the components of the panel device 52 need to be replaced (e.g. the film component 58, the display panel 60, the backlight component and so on), the replaced components can be extracted from the opening 78.

Figure 6:
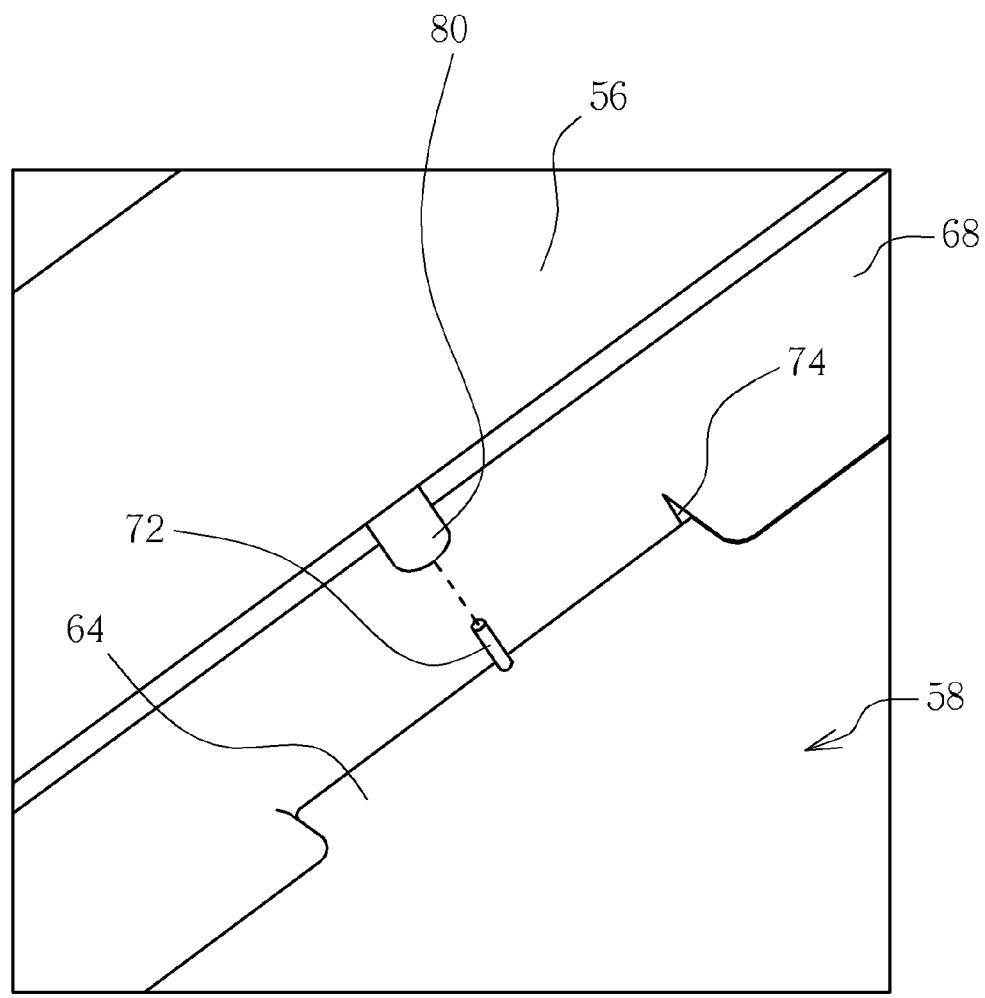
FIG. 6 is a partial enlarged diagram of an upper casing and the holding structure in FIG. 3.

Next, please refer to FIG. 6, which is a partial enlarged diagram of the upper casing 56 and the holding structure 68 in FIG. 3. The upper casing 56 has an upper pillar 80. As shown in FIG. 6, the upper pillar 80 is used for sheathing the bottom pillar 72 to fix the positioning lug 64, such that the film component 58 can be fixed onto the holding structure 68.

The following description illustrates an assembly process of the display module 50. Please refer to FIG. 3, FIG. 4, and FIG. 6. First of all, the backlight component 62 is disposed in the containing space 76 formed by the holding structure 68 cooperatively with the casing body 66 shown in FIG. 4. Next, the positioning lug 64 of the film component 58 is aligned with the recessed portion 74 of the holding structure 68, and the film component 58 is put downward along a –Z direction shown in FIG. 4 until the positioning lug 64 is penetrated by the bottom pillar 72 of the holding structure 68 and is then contained in the recessed portion 74. At this time, the display module 50 can constrain motion of the film component 58 toward a ±X-axis direction, a ±Y-axis direction and the –Z axis direction by assembly of the positioning lug 64, the recessed portion 74 and the bottom pillar 72. After the display panel 60 is disposed on the panel containing portion 70, the upper pillar 80 of the upper casing 56 can be aligned with the bottom pillar 72 as shown in FIG. 6, and the upper casing 56 can be then moved toward the –Z-axis direction until the upper pillar 80 sheathes the bottom pillar 72. Accordingly, motion of the film component 58 toward a +Z-axis direction can be constrained. Meanwhile, assembly of the bottom casing 54 and the upper casing 56 can fix the display panel 60 and the backlight component 62 as well. Accordingly, the assembly process of the display module 50 is completed.

On the other hand, if the components of the panel device 52 need to be replaced (e.g. the film component 58, the display panel 60, the backlight component 62 and so on), the upper casing 56 can be detached from the bottom casing 54 to release fixing between the upper pillar 80 and the bottom pillar 72. Accordingly, the display panel 60, the film component 58 or the backlight component 62 can be extracted from the opening 78 located on the side of the holding structure 68 along the +Y-axis direction shown in FIG. 5.

For example, if the film component 58 (e.g. a lens film, a diffuser film and so on) needs to be replaced, the upper casing 56 can be detached from the bottom casing 54 first. Subsequently, since motion of the positioning lug 64 of the film component 58 toward the +Z-axis direction is no more constrained by the upper pillar 80 and the bottom pillar 72, the film component 58 can be lifted along the +Z-axis direction in FIG. 4 to move the positioning lug 64 away from the bottom pillar 72 until the positioning lug 64 is completely detached from the bottom pillar 72 and the recessed portion 74. Afterwards, the film component 58 can be extracted from the opening 78 along the +Y-axis direction shown in FIG. 5 since motion of the film component 58 toward the ±X-axis direction, the ±Y-axis direction and the –Z-axis direction is no more constrained by the positioning lug 64, the bottom pillar 72 and the recessed portion 74. Finally, after a new film component is inserted into the opening 78 along the –Y-axis direction shown in FIG. 5 and is then fixed between the bottom casing 54 and the upper casing 56 by the bottom pillar 72 and the recessed portion 74, replacement of the film component is completed accordingly.

In summary, the display module 50 can constrain motion of the film component 58 toward the ±X-axis direction, ±Y-axis direction and ±Z-axis direction simultaneously by the said assembly of the positioning lug 64, the recessed portion 74 and the bottom pillar 72 as well as fixing between the upper pillar 80 and the bottom pillar 72. In such a manner, three-axis positioning of the film component 58 can be achieved. Accordingly, the film component 58 can be firmly fixed between the bottom casing 54 and the upper casing 56. As for the backlight component 62 and the display panel 60, they can be fixed between the bottom casing 54 and the upper casing 56 by being respectively contained in the containing space 76 and the panel containing portion 70 via the said assembly process.

It should be noticed that the upper pillar of the upper casing and the bottom pillar of the bottom casing are an alternative design and the recessed portion, the panel containing portion and the containing space are an omissible design, so as to simplify the structural design of the display module and reduce its manufacturing cost. As for which design is utilized, it depends on the manufacturing needs of the display module. For example, the display module can only utilize the bottom pillar of the bottom casing or the upper pillar of the upper casing to fix the film component. Alternatively, assuming disposal of the recessed portion, the panel containing portion and the containing space is omitted, the display module can only utilize assembly of the positioning lug, the upper pillar, and the bottom pillar to fix the film component, and utilize assembly of the upper casing and the bottom casing to fix the backlight component. As for other related disposal variation, it can be reasoned by analogy and therefore omitted herein.

Compared with the prior art, in which a plastic frame is still needed to fix a display panel when disposal of a back plate is omitted, the display module of the present invention utilizes assembly of the holding structure integrally formed on the bottom casing and the upper casing to fix the panel device instead. Accordingly, disposal of the plastic frame can be further omitted. In such a manner, the assembly problem mentioned in the prior art can be solved, so as to enhance manufacturing efficiency of the display module. Furthermore, the problem that the protruding structure of the positioning lug of the plastic frame constrains the circuit layout of the display module can be also avoided, so as to increase design flexibility of the display module in circuit layout and reduce the possibility that foreign objectives enter the display module.

Those skilled in the art will readily observe that numerous modifications and alterations of the device and method may be made while retaining the teachings of the invention.

What is claimed is:

1. A display module comprising:
   a bottom casing comprising:
      a casing body; and
      a holding structure integrally formed on the casing body and having a bottom pillar;
   a panel device disposed on the bottom casing, the panel device comprising:
      at least one film component having at least one positioning lug, the positioning lug being used for disposing around the bottom pillar so as to position the film component on the holding structure; and
      a display panel disposed on the holding structure; and
   an upper casing disposed on the panel device for fixing the panel device cooperatively with the bottom casing;
   wherein an opening is formed on an outer side wall of the holding structure so that the panel device could pass through the opening and then be laterally extracted from the holding structure in a direction different from an installation direction of the panel device.

2. The display module of claim 1, wherein the holding structure further has a panel containing portion, and the panel containing portion is used for holding the display panel.

3. The display module of claim 1, wherein the upper casing has an upper pillar, and the upper pillar is used for sheathing the bottom pillar so as to fix the film component onto the holding structure.

4. The display module of claim 1, wherein the holding structure forms a containing zone cooperatively with the casing body, the panel device further comprises at least one backlight component, and the backlight component is disposed in the containing zone.

5. The display module of claim 1, wherein the holding structure further has a recessed portion, and the recessed portion is used for containing the positioning lug so as to position the film component on the holding structure.

6. A display module comprising:
   a bottom casing comprising:
      a casing body; and
      a holding structure integrally formed on the casing body;
   a panel device disposed on the bottom casing, the panel device comprising:
      at least one film component having at least one positioning lug; and
      a display panel disposed on the holding structure; and
   an upper casing disposed on the panel device and having an upper pillar, the upper pillar being used for disposing through the positioning lug so as to position the film component on the holding structure when the upper casing fixes the panel device cooperatively with the bottom casing;
   wherein an opening is formed on an outer side wall of the holding structure so that the panel device could pass through the opening and then be laterally extracted from the holding structure in a direction from an installation direction of the panel device.

7. The display module of claim 6, wherein the holding structure further has a panel containing portion, and the panel containing portion is used for holding the display panel.

8. The display module of claim 6, wherein the holding structure forms a containing zone cooperatively with the casing body, the panel device further comprises at least one backlight component, and the backlight component is disposed in the containing zone.

9. The display module of claim 6, wherein the holding structure further has a recessed portion, and the recessed portion is used for containing the positioning lug so as to position the film component on the holding structure.

10. A display module comprising:
    a bottom casing comprising:
       a casing body; and
       a holding structure integrally formed on the casing body, the holding structure having a bottom pillar and a panel containing portion continuously formed along an inner side wall of the holding structure;
    a panel device disposed on the bottom casing, the panel device comprising:
       at least one film component having at least one positioning lug, the positioning lug being used for disposing around the bottom pillar so as to position the film component on the holding structure; and
       a display panel disposed on the panel containing portion of the holding structure; and
    an upper casing disposed on the panel device for fixing the panel device cooperatively with the bottom casing.

11. The display module of claim 10, wherein the upper casing has an upper pillar, and the upper pillar is used for sheathing the bottom pillar so as to fix the film component onto the holding structure.

12. The display module of claim 10, wherein the holding structure forms a containing zone cooperatively with the casing body, the panel device further comprises at least one backlight component, and the backlight component is disposed in the containing zone.

13. The display module of claim 10, wherein the holding structure further has a recessed portion, and the recessed portion is used for containing the positioning lug so as to position the film component on the holding structure.

14. The display module of claim 10, wherein an opening is formed at a side of the holding structure, and the opening is used for replacing the panel device.

15. A display module comprising:
    a bottom casing comprising:
       a casing body; and
       a holding structure integrally formed on the casing body, the holding structure having a panel containing portion continuously formed along an inner side wall of the holding structure;
    a panel device disposed on the bottom casing, the panel device comprising:
       at least one film component having at least one positioning lug; and
       a display panel disposed on the panel containing portion of the holding structure; and
    an upper casing disposed on the panel device and having an upper pillar, the upper pillar being used for disposing through the positioning lug so as to position the film component on the holding structure when the upper casing fixes the panel device cooperatively with the bottom casing.

16. The display module of claim 15, wherein the holding structure forms a containing zone cooperatively with the casing body, the panel device further comprises at least one backlight component, and the backlight component is disposed in the containing zone.

17. The display module of claim 15, wherein the holding structure further has a recessed portion, and the recessed portion is used for containing the positioning lug so as to position the film component on the holding structure.

18. The display module of claim 15, wherein an opening is formed at a side of the holding structure, and the opening is used for replacing the panel device.

\* \* \* \* \*